(12) United States Patent
Oweyang et al.

(10) Patent No.: US 7,341,939 B2
(45) Date of Patent: Mar. 11, 2008

(54) METHOD FOR PATTERNING MICRO FEATURES BY USING DEVELOPABLE BOTTOM ANTI-REFLECTION COATING

(75) Inventors: Dah-Chung Oweyang, Baoshan Township, Hsinchu County (TW); Chih-Cheng Lin, Baoshan Township, Hsinchu County (TW); Hsueh-Liang Hung, Yung Ho (TW); Bang-Chein Ho, Hsin-Chu (TW)

(73) Assignee: Taiwan Semiconductor Maunfacturing Co., Ltd., Hsin-Chu (TW)

( * ) Notice: Subject to any disclaimer, the term of this patent is extended or adjusted under 35 U.S.C. 154(b) by 321 days.

(21) Appl. No.: 11/061,056

(22) Filed: Feb. 18, 2005

(65) Prior Publication Data

US 2006/0189146 A1    Aug. 24, 2006

(51) Int. Cl.
*H01L 21/4763*    (2006.01)

(52) U.S. Cl. .............. 438/636; 438/638; 438/E21.029; 438/E21.039

(58) Field of Classification Search .......... 438/636, 438/72, 952; 430/326; 257/E21.029, E21.039
See application file for complete search history.

(56) References Cited

U.S. PATENT DOCUMENTS

| | | | |
|---|---|---|---|
| RE31,220 E | * | 4/1983 | Ernsberger ................. 65/30.13 |
| 5,258,266 A | | 11/1993 | Tokui et al. |
| 5,429,910 A | * | 7/1995 | Hanawa ..................... 430/313 |
| 6,242,164 B1 | | 6/2001 | Choi et al. |
| 6,869,737 B2 | * | 3/2005 | Suzuki et al. .............. 430/311 |

OTHER PUBLICATIONS

Liu He et al., Bottom Anti-Reflective Coatings (BARCs) for 157-nm Lithography, Copyright 2003 Society of Photo-Optical Instrumentation Engineers, pp. 1-10.

* cited by examiner

*Primary Examiner*—Dung A. Le
(74) *Attorney, Agent, or Firm*—Duane Morris LLP (57) ABSTRACT

In the manufacture of a semiconductor, a DBARC layer is deposited upon a wafer to prevent reflection. A photo resist layer is deposited upon the DBARC layer and the wafer is selectively exposed to irradiation. The irradiation generates photo acid (H+ ions) in the exposed areas of the photo resist and DBARC. In order to provide better resolution in the DBARC for micro-features, an electric field is generated vertically through the coated wafer before or during post exposure baking (PEB) to create a uniform vertical distribution of H+ ions though the DBARC. The coated wafer is then developed to remove either the unexposed portions, or exposed portion of the DBARC. The cavities formed by the developer have side walls that are substantially vertical as a result of the uniform vertical distribution of the H+ ions.

13 Claims, 7 Drawing Sheets

FIG. 1

Prior Art

FIG. 2

Prior Art

METHOD FOR PATTERNING MICRO FEATURES BY USING DEVELOPABLE BOTTOM ANTI-REFLECTION COATING

BACKGROUND

Bottom anti-reflective coatings (BARCs) have been widely used in conjunction with photo resists in the manufacture of semiconductors during the photolithography step of the process. The primary benefits of BARCs in photolithography are focus/exposure latitude improvement, enhanced critical dimension (CD) control, elimination of reflective notching, and protection of developable resist from substrate poisoning. In the past, BARCs have mainly been used in critical layers such as gate and contact layers. As integrated circuit feature sizes continue to shrink, the application of a BARC in implant layers becomes more desirable because the tolerances of reflective notching and CD variations caused by wafer topography are getting relatively smaller.

Developable BARCs (DBARCs) have been developed specifically for implant layer applications. The feasibility of using traditional dry-etch BARCs is very questionable because they introduce more process complexity and more defectivity and potentially cause unnecessary substrate damage.

Figure 1:
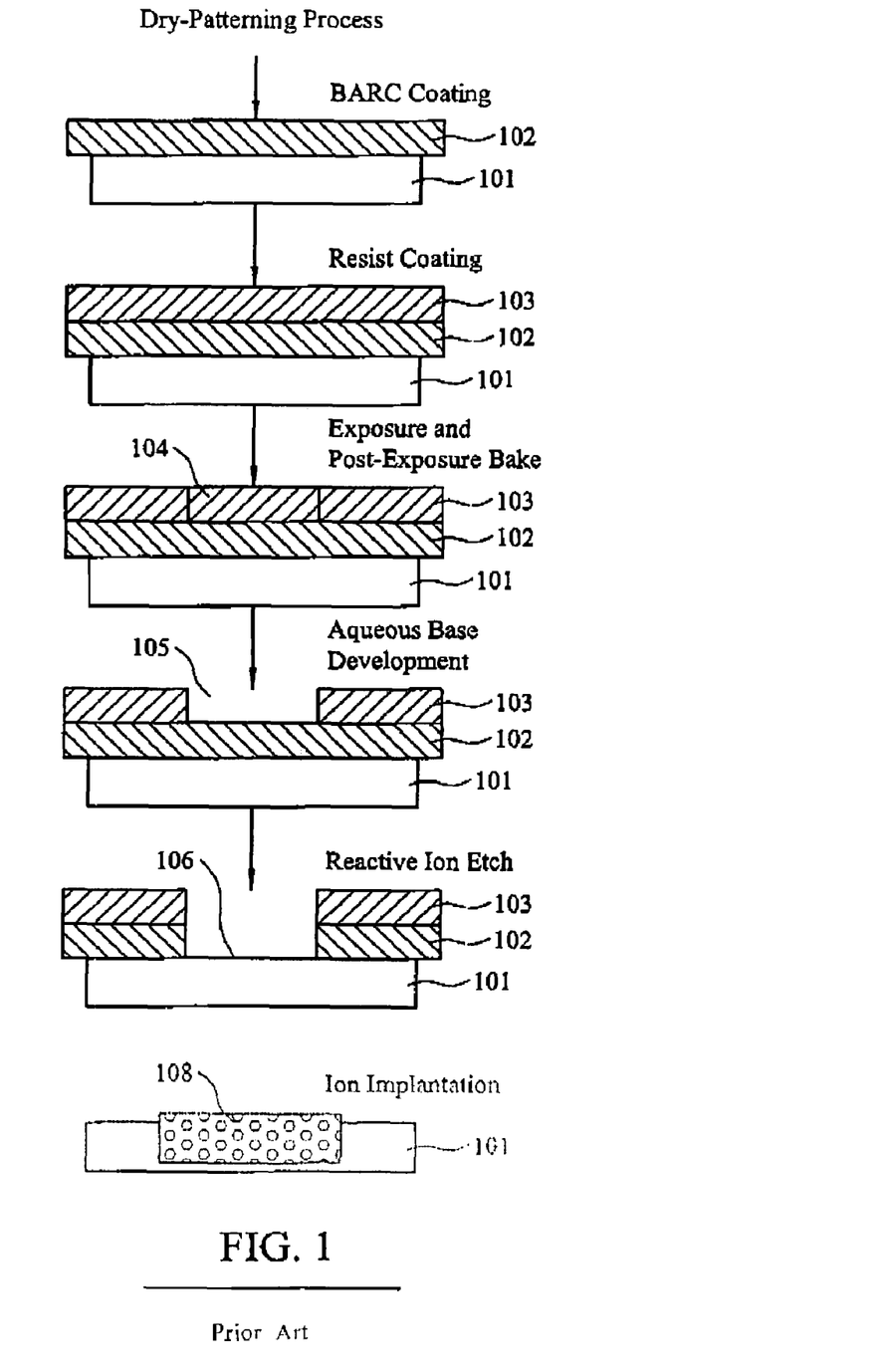
FIG. 1 is a representation of a prior art dry patterning method.

A prior art method of dry patterning process using dry etch BARC's is shown in FIG. 1. In the dry patterning process, a BARC coating 102 is deposited on the substrate 101 or wafer, a resist coating 103 is applied over the BARC coating 102. The coated substrate is then selectively exposed to irradiation and undergoes a post-exposure bake. After the bake, an aqueous base development dissolves the exposed resist and a reactive ion etch removes the BARC coating underlying the removed resist. The area vacated by the resist and BARC is the subject to ion implantation.

Figure 2:
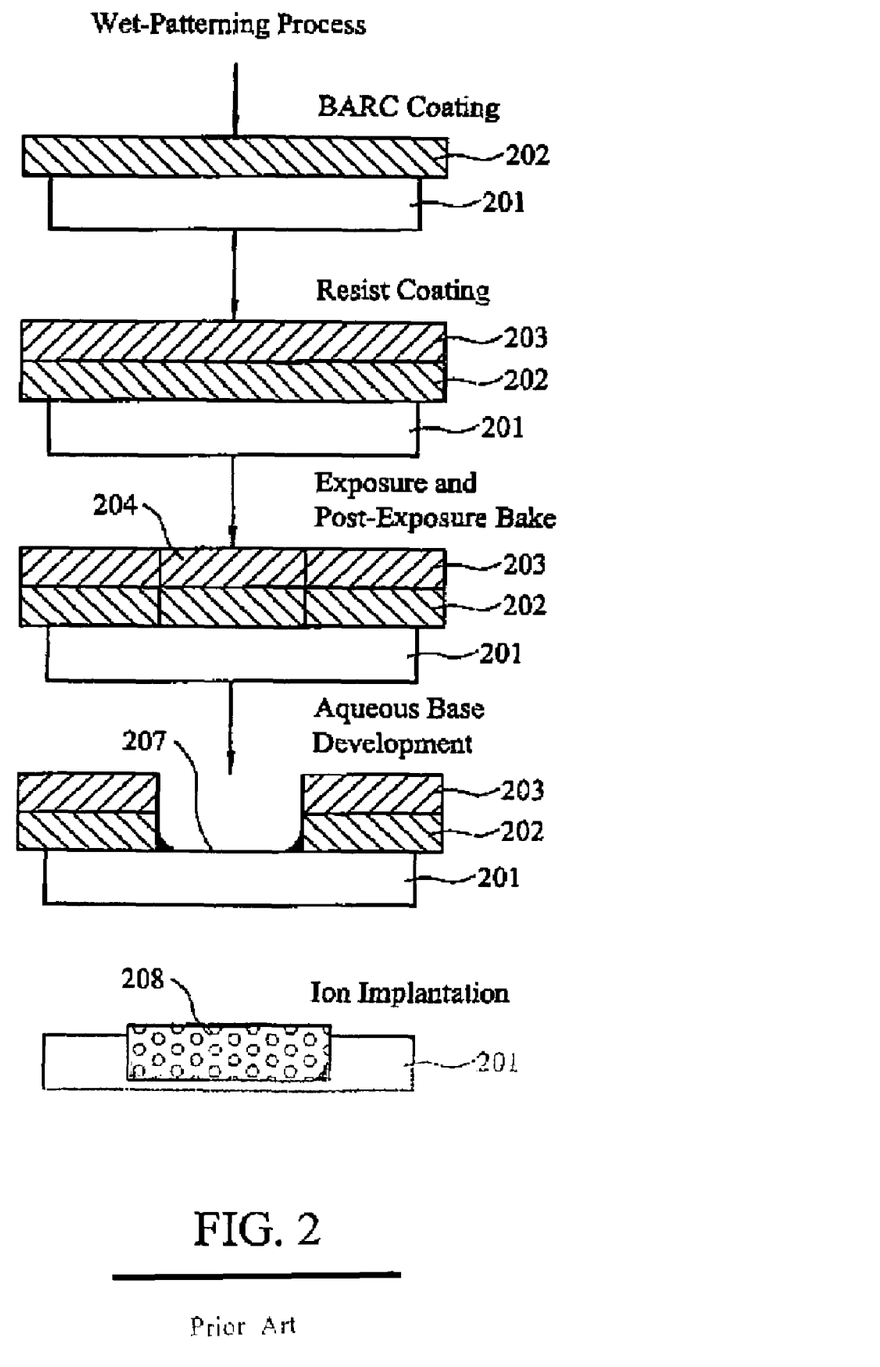
FIG. 2 is a representation of a prior art wet patterning method.

A prior art method of wet-patterning process using DBARC is shown in FIG. 2. Similarly to the dry patterning process, a DBARC coating 202 is deposited on the substrate 201; a resist coating 203 is applied over the DBARC coating 202. The coated substrate is then selectively exposed to irradiation and undergoes a post-exposure bake. After the bake, an aqueous base development dissolves the exposed resist and unlike the dry patterning process dissolves the exposed DBARC coating as well.

While dry etch BARCS are used extensively for critical lithography layers requiring plasma pattern transfer, they typically cannot be used for implant layers for several reasons. First the etch process to clear the BARC is complex because controlling the etch end point is very difficult which makes the implant and diffusion process also difficult to control. Secondly, adjusting implant energies to penetrate appropriately through the remaining BARC layer is difficult. The BARC thickness may vary in relation to the local topography of the substrate or wafer. Lastly Ions used for the dry-etch step are highly energetic and may participate in the implant and diffusion process to decrease the efficiency of silicon performance.

Like any other BARC, DBARC is an organic liquid coating material used in conjunction with a photo resist during the photolithography step of the process to manufacture semiconductors. The difference between a DBARC and a dry-etch BARC in the lithographic process is that the DBARC is soluble in developer so it can be remove during the resist development step.

Figure 3A:
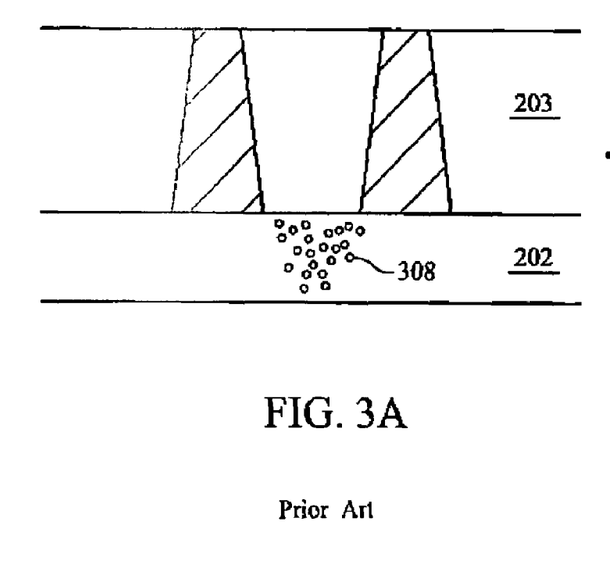
FIG. 3A is a representation of the distribution of photo acid in prior art wet patterning method.
Figure 3B:
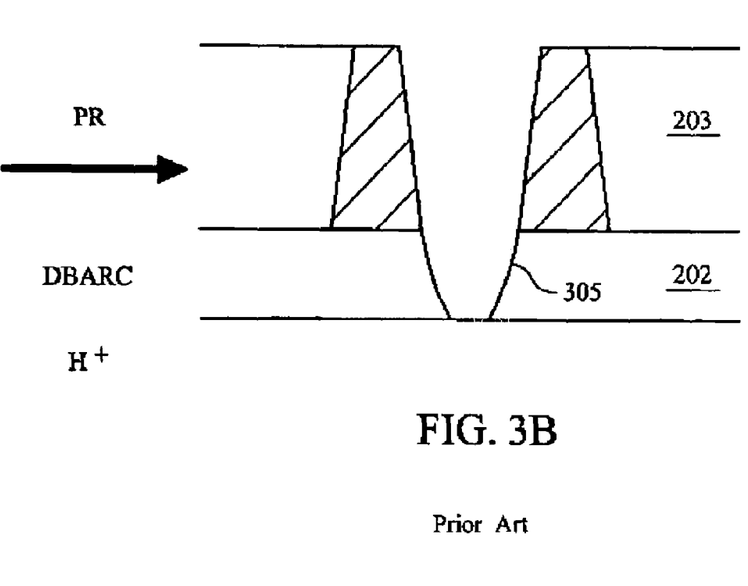
FIG. 3B is a representation of the result from developing in prior art wet patterning method.

The advantages of using DBARC are also numerous. The number of process steps is reduced, substrate damage by plasma etching is eliminated, and thickness loss due to BARC etch is avoided. A major disadvantage to using DBARC is that it has limited resolution compared to dry-etch BARC because is very difficult to get a vertical pattern profile and reduce the standing wave. FIG. 3a is a representation of the photo acid distribution in the DBARC after heating. This distribution on and about the top surface of the photo acid 380 in the DBARC is a result of the anti-reflective properties of DBARC. A result of this distribution, a vertical profile of the side walls 305 is not effected after developing the DBARC coating as shown in FIG. 3b.

It is thus an object of the present disclosure to obviate the disadvantage associated with the prior art and present a method to create a uniform vertical distribution of photo acid in the exposed DBARC layer by applying an electric field through the DBARC layer before or during the baking process.

It is also an object of the present disclosure to present a novel improvement for a method of making a semiconductor. The method including the steps of coating a substrate with a bottom anti-reflection coating; forming a resist film on the substrate over the anti reflection coating; selectively irradiating said resist film with light; after said irradiation, heating said resist film and applying an electric field to said resist film. The method also including the step of developing the resist film to remove selected portions of the resist film, where the developing step is performed subsequent to the electric field application. The novel improvement including using a developable bottom anti-reflection coating.

It is yet another object of the present disclosure to present a novel improvement for a method of making a semiconductor. The method including the steps of coating a substrate with a developable bottom anti-reflection coating, forming a resist film on the substrate over the anti reflection coating; selectively irradiating said resist film and developable bottom anti-reflection coating with light; and after irradiation, heating the resist film and developable bottom anti-reflection coating. The method also including developing the resist film and developable anti-reflection coating to remove selected portions of the resist film and selected portions of the developable anti-reflection coating. The novel improvement including applying an electric field to the developable anti-reflection coating after the step of irradiation and prior to the step of developing.

It is still another object of the present disclosure to present a novel method for patterning micro features by using a developable bottom anti-reflection coating. The method including the steps of diffusing the photo acid is one direction by a post exposure baking process and application of an electric field in the developable bottom anti-reflection coating layer.

It is also another object of the present disclosure to present a novel method to obtain a vertical distribution of photo acid in a selected portion of a developable bottom anti-reflective reflective coating layer. The method including selectively irradiating the developable bottom anti-reflection coating to form an area of concentrated photo acid on a portion of an upper surface of the developable bottom anti-reflection coating. The method also including, after irradiating, applying a vertical electric field normal to the upper s surface of the developable bottom anti reflection coating through the developable anti-reflection coating to diffuse the photo acid in a vertical direction.

These objects and other advantages of the disclosed subject matter will be readily apparent to one skilled in the art to which the disclosure pertains from a perusal or the claims, the appended drawings, and the following detailed description of the preferred embodiments.

DETAILED DESCRIPTION

Embodiments of the present subject matter will be described in the following with reference to the figures. FIGS. 4A-4E are cross section view showing process step of one embodiment of the present subject matter.

Figure 4A:
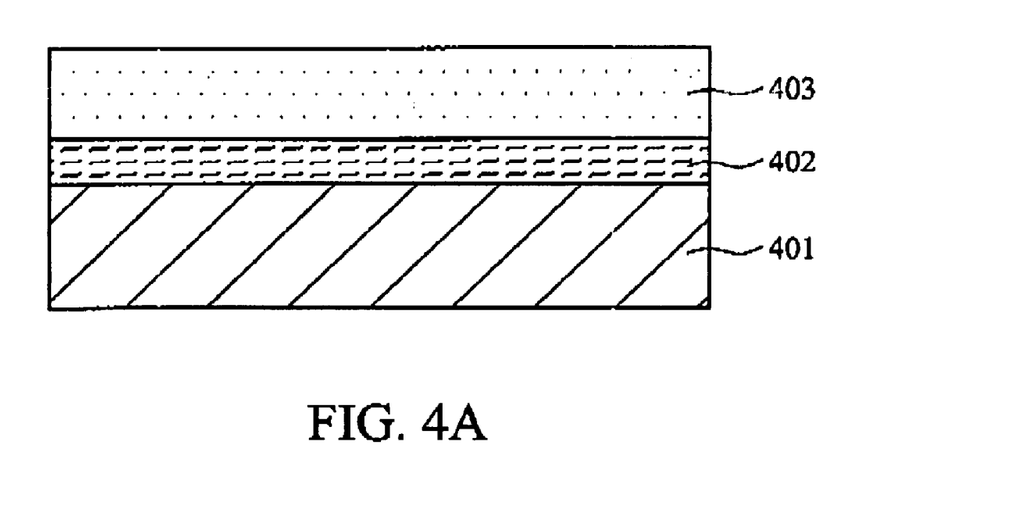
FIGS. 4A-E are representative of a process for manufacturing a semiconductor according to an embodiment of the present subject matter.

Referring to FIG. 4A, a silicon substrate 401 is prepared and a DBARC layer 402 is applied to the upper surface of the silicon substrate 401. A deposit is applied on the silicon substrate by spin coating or other known deposition process whereby a resist film 403 having an arbitrary and selectable thickness is formed.

Figure 4B:
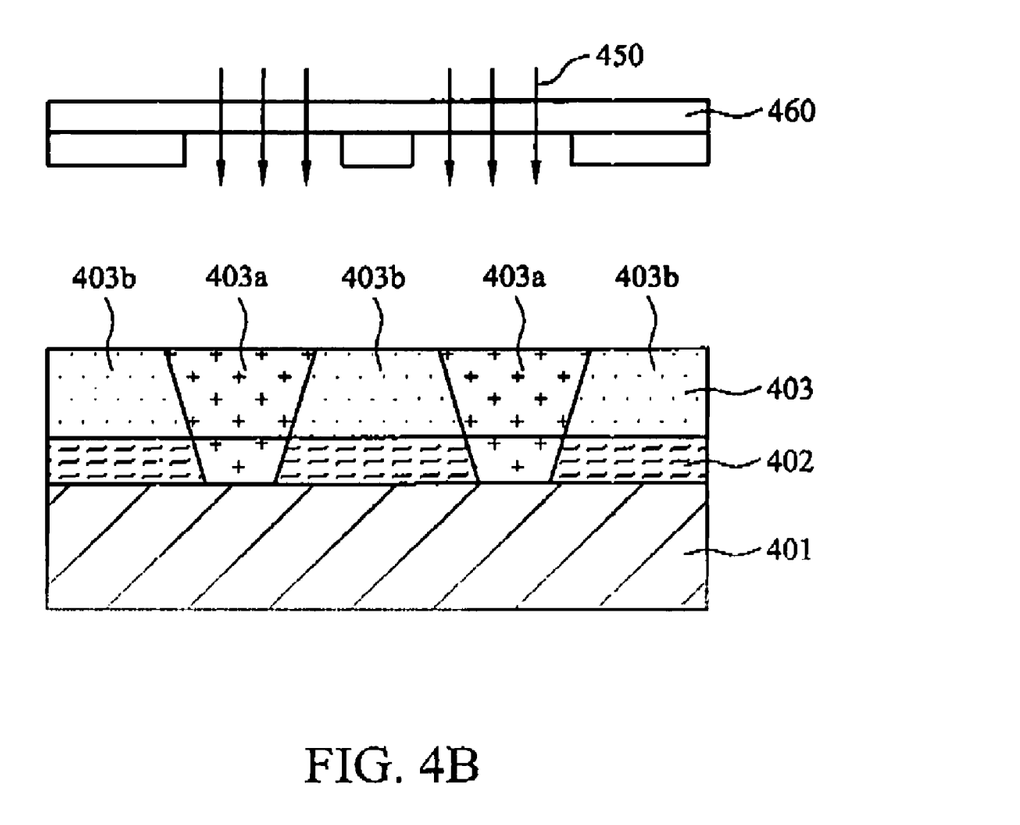

Referring to FIG. 4B, exposure to KrF or ArF scanner or stepper 450 is carried out using a photo mask 460, in accordance with the reduction type projection printing. Consequently, exposed areas 403a and unexposed areas 403b are provided on the resist film 403 and the top portion of the DBARC 402. In the exposed areas 403a, H+ ions (simply represented by the sign + in the figure), which are the catalyst of cross-linking reaction are generated. Because of the absorption and anti-reflection characteristic of the DBARC layer 402, H+ ions are generated in a greater extent in the upper portion of the DBARC 402 and the concentration of H+ ions is reduced in the lower portions of the DBARC 402 as shown previously in FIG. 3A.

Figure 4C:
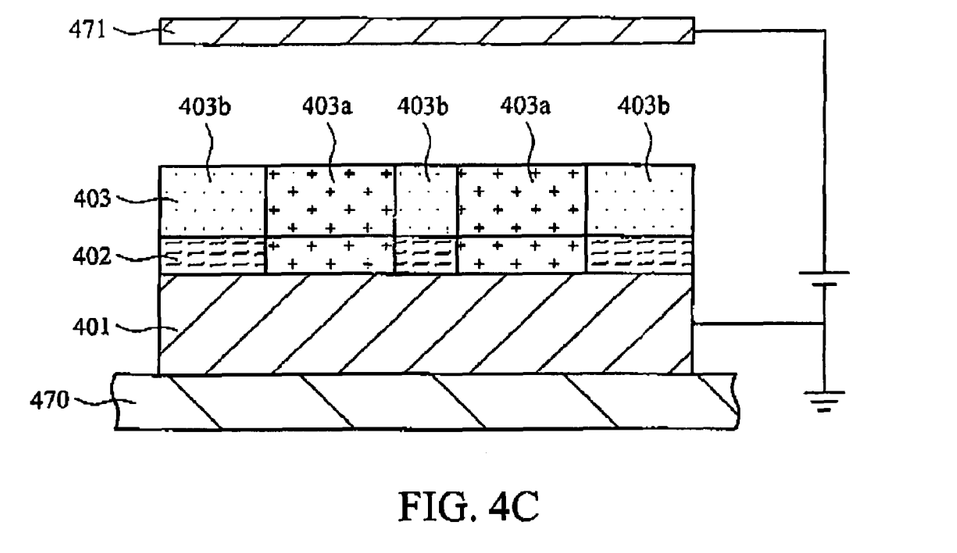

Referring to FIG. 4C, the silicon substrate 401 is placed on a hot plate 407 and an opposing electrode 471, such as a conductive plate, is provided facing the silicon substrate above the substrate. A potential is applied between the opposing electrode 471 and the silicon substrate 401 while the coated substrate is subject to post exposure baking (PEB) by means of the hot plate 420 or other baking apparatus. The potential is applied with the opposing electrode 471 being a positive electrode and the silicon substrate being a negative electrode. Consequently, an electric field directed vertically downward is excited in the DBARC layer 402. Alternatively, a second conductive plate may be placed between the hot plate and the substrate to act as the negative electrode.

Figure 4D:
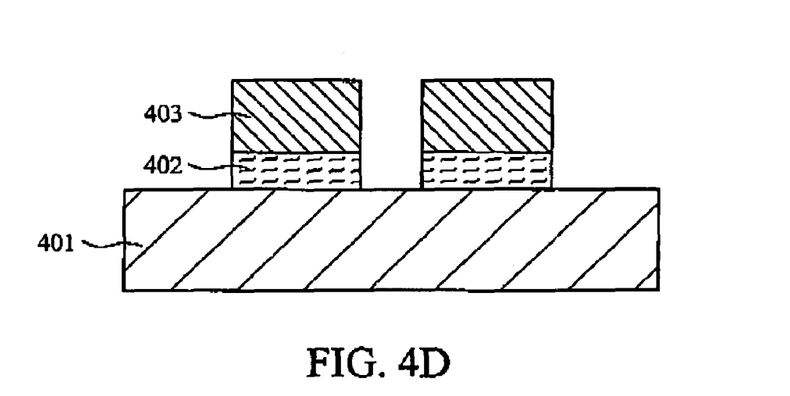

When an electric field directed vertically downward through the resist film 403 and DBARC layer 402 is applied while the exposed coated substrate is heated as in the present embodiment. The H+ ions which are the catalyst of the cross-linking reaction generated in the DBARC move vertically downward simultaneously with the thermal diffusion. Consequently, the diffusion of the H+ ions is in a vertical direction during heating and thus when the resist film 403 and the DBARC 402 is developed by a developer, for example a Tetra methyl ammonium hydroxide solution (TMAH), a negative pattern having sidewalls formed substantially vertical to the silicon substrate is achieved as shown in FIG. 4D.

Figure 4E:
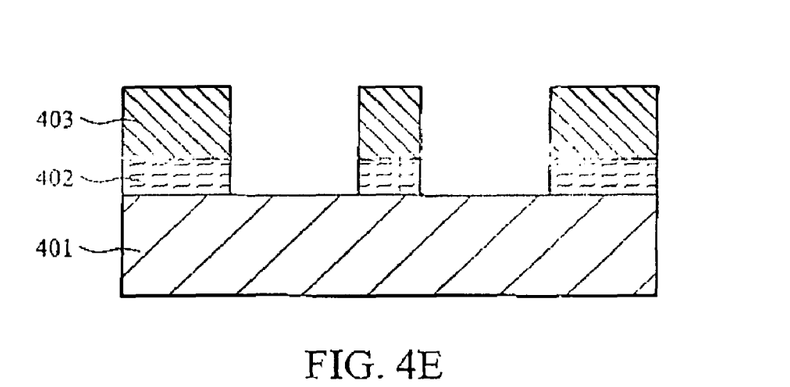

In another embodiment of the present subject matter a positive pattern having side wall formed substantially vertical to the silicon substrate may be achieved as shown in FIG. 4E. In forming a positive pattern the H+ ion in the exposed area is a catalyst of de-blocking reaction for increasing the solubility of the DBARC to the developer.

Figure 5A:
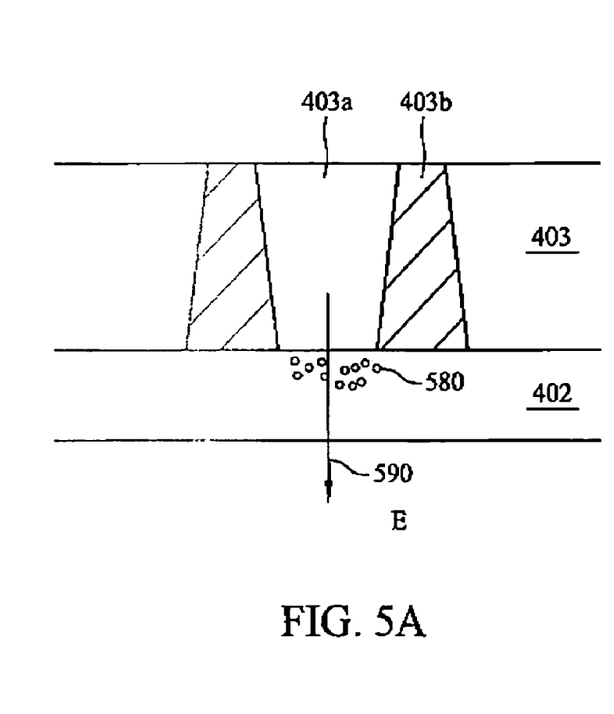
FIGS. 5A and 5B are representations of a process for creating a vertical distribution of photo acid in the DBARC layer according to an embodiment of the present subject matter.
Figure 5B:
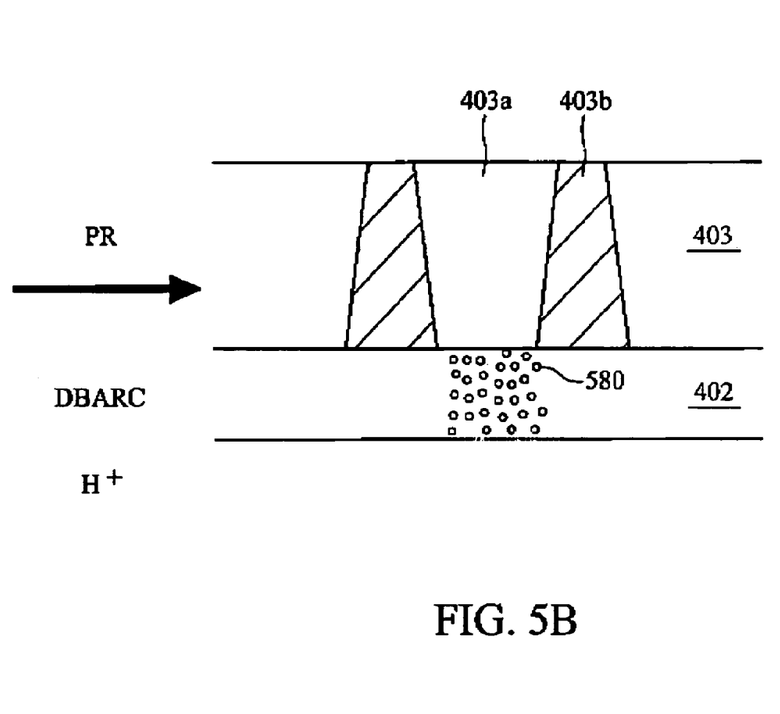

A more detailed representation is shown in FIGS. 5A-5B, in which the focus is directed to the DBARC layer 402. After irradiation, a top portion of the DBARC layer 402 that was exposed to irradiation has a high concentration of photo acid (H+ ion) 580 as shown in FIG. 5a. As a result of the E-field 590, the photo acid is diffused in the downward vertical direction. After the application of an E-field 590 a uniform vertical distribution is achieved as shown in FIG. 5B. The application of the E-field is performed after the irradiation of the DBARC layer 402. Additionally, the application of the E-field may be prior to or concurrent with the PEB.

Figure 6:
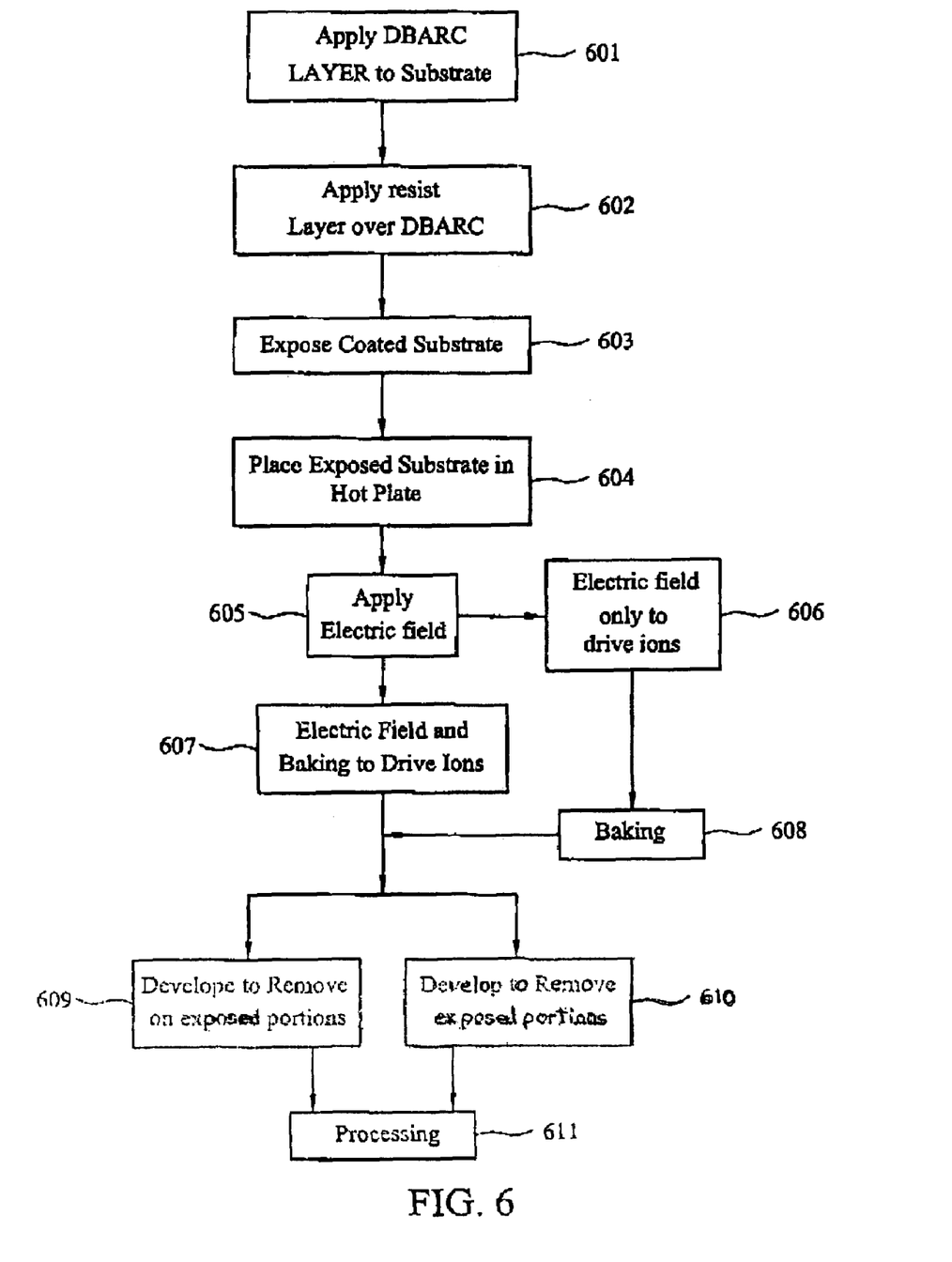
FIG. 6 is a representative flow chart for making a semiconductor according to an embodiment of the present subject matter.

An exemplary embodiment is shown in FIG. 6. A silicon wafer or patterned structure wafer is coated with a DBARC layer as shown in Block 601. As explained previously, the purpose of the DBARC layer is to minimize the reflection from the substrate in order to reduce the swing effect and standing wave. A KrF or ArF resist is then coated on the DBARC layer as shown in Block 602. The coated wafer is sent to a KrF or Arf stepper or scanner for selective exposure (irradiation) as shown in Block 603. During the exposure, photo acid generation (PAG) in the resist and components of the DBARC generate acid by the irradiation. Due to the high absorption of the DBARC layer, there is much more acid in the top of the DBARC layer than the bottom.

The exposed wafer is sent to a hot plate unit or other baking apparatus as shown in Block 604. A thermal plate in the hot plate is grounded and a conductive plate is added at the top of the plate with a voltage applied to it to induce an electric field vertically through the wafer as shown in Block 605. With the electric field only, as shown in Block 606 or the electric field and heat as shown Block 607, the acid in the DBARC is driven from the top of the DBARC towards the bottom of the DBARC. After application of the electric field, with reference to Block 606, PEB is performed in Block 608. As a result of the process the uniformity of acid in the DBARC in the z direction in improved within the exposure area.

After the electric field application and the PEB, the wafer is developed with a developer to remove the unexposed, or alternatively, exposed portions of the resist and DBARC as shown in Blocks 609 and 610 respectively. The wafer is then ready for ion implantation or other further processing as shown in Block 611.

While preferred embodiments of the present inventive system and method have been described, it is to be understood that the embodiments described are illustrative only and that the scope of the embodiments of the present inventive system and method is to be defined solely by the appended claims when accorded a full range of equivalence, many variations and modifications naturally occurring to those of skill in the art from a perusal hereof.

What we claim is:

1. In a method of making a semiconductor device including the steps of coating a substrate with a bottom anti-reflection coating layer, forming a resist film over the anti reflection coating layer; selectively irradiating said resist film and said bottom anti-reflection coating layer with light; after said irradiation, heating said resist film; after said irradiation, applying an electric field to said bottom anti-reflection coating layer; and developing the resist film to remove selected portions of the resist film, the developing step being performed subsequent to the electric field application, the improvement comprising: using a developable bottom anti-reflection coating.

2. The method of claim 1, wherein the step of selectively irradiating said resist film with light further comprises selectively irradiating said developable bottom anti-reflection coating.

3. The method of claim 1, wherein the step of heating said resist film further comprises heating said developable bottom anti-reflection coating.

4. The method of claim 1, wherein the step of applying an electric field to said bottom anti-reflection coating layer further comprises applying an electric field to said resist film.

5. The method of claim 1, wherein the step of developing the resist film further comprises the step of developing said developable bottom anti-reflection coating.

6. The method of claim 1, wherein the step of applying an electric field to said bottom anti-reflection coating precedes the step of heating said resist film.

7. The method of claim 1, wherein the step of applying an electric field to said bottom anti-reflection coating and the step of heating said resist film are at least in part concurrent.

8. The method of claim 1, wherein the selected portions are portions selected for irradiation forming a positive pattern.

9. The method of claim 1, wherein the selected portions are portions not selected for irradiation forming a negative pattern.

10. A method of making a semiconductor device comprising:

coating a substrate with a developable bottom anti-reflection coating layer;

forming a resist film over the developable anti reflection coating layer;

selectively irradiating the resist film and the developable bottom anti-reflection coating with light;

after the selective irradiation, heating the resist film;

after the selective irradiation, applying an electric field to the developable bottom anti-reflection coating; and after the applying an electric field, developing the resist film to remove selected portions of the resist film.

11. The method of claim 10, wherein the applying an electric field to the developable bottom anti-reflection coating further comprises applying an electric field to the resist film.

12. The method of claim 10, wherein the developing the resist film further comprises developing the developable bottom anti-reflection coating.

13. The method of claim 10, wherein the selectively irradiating the developable bottom anti-reflection coating renders the developable bottom anti-reflection coating partially developable and the applying an electric field to the developable bottom anti reflection coating comprises causing the developable bottom anti-reflection coating to become developable.

* * * * *